(12) United States Patent
Iriguchi

(10) Patent No.: US 7,547,589 B2
(45) Date of Patent: Jun. 16, 2009

(54) METHOD FOR FABRICATING SEMICONDUCTOR DEVICE, AND ELECTRO-OPTICAL DEVICE, INTEGRATED CIRCUIT AND ELECTRONIC APPARATUS INCLUDING THE SEMICONDUCTOR DEVICE

(75) Inventor: Chiharu Iriguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 320 days.

(21) Appl. No.: 10/840,297

(22) Filed: May 7, 2004

(65) Prior Publication Data

US 2005/0026340 A1    Feb. 3, 2005

(30) Foreign Application Priority Data

May 15, 2003    (JP)    ............................. 2003-137405

(51) Int. Cl.
*H01L 21/00* (2006.01)
(52) U.S. Cl. ...................... 438/149; 438/151; 438/164; 438/585
(58) Field of Classification Search ................ 438/149, 438/154, 197, 151, 164, 585
See application file for complete search history.

(56) References Cited

U.S. PATENT DOCUMENTS

| | | | |
|---|---|---|---|
| 4,734,345 A * | 3/1988 | Nomura et al. ................. | 430/1 |
| 4,734,383 A | 3/1988 | Ikeda et al. | |
| 5,625,471 A * | 4/1997 | Smith ........................... | 359/30 |
| 5,821,562 A * | 10/1998 | Makita et al. .................. | 257/64 |
| 6,104,471 A * | 8/2000 | Morioka et al. ............... | 355/53 |
| 6,168,637 B1 | 1/2001 | Randolph et al. | |
| 6,599,785 B2 * | 7/2003 | Hamada et al. ............. | 438/151 |
| 6,610,448 B2 | 8/2003 | Sato et al. | |

(Continued)

FOREIGN PATENT DOCUMENTS

CN    85109742 A    7/1986

(Continued)

OTHER PUBLICATIONS

Laser Holographic Lithography and Applications, Song Dengyuan (Department of Electronics and Information Engineering, Heibei University, Baoding 0710002), Wang Xiaoping (Zhangjiakou Vocational University, Ahangjiakou, 075000) (including English-language translation), 12 pages.

(Continued)

*Primary Examiner*—Michael Trinh
(74) *Attorney, Agent, or Firm*—Oliff & Berridge, PLC

(57)    ABSTRACT

The invention provides a technique that enables formation of minute patterns on an uneven substrate in volume production without reducing productivity. The method for fabricating a semiconductor device includes: first patterning a semiconductor film on a substrate to form element regions, each of which will be provided with a source/drain region and a channel region, second forming a gate insulating film covering segments of the patterned semiconductor film in the respective element regions, third forming gate electrodes on the gate insulating film at predetermined positions, and fourth forming the source/drain region and the channel region in each element region. At least the gate electrodes are formed by a process including an exposure step through a holographic exposure mask in the third step, and by a process including an exposure step through a projection exposure mask, the element regions are formed in the first step, and the source/drain regions and the channel regions are formed in the fourth step.

17 Claims, 7 Drawing Sheets

U.S. PATENT DOCUMENTS

| | | | |
|---|---|---|---|
| 6,872,658 B2 * | 3/2005 | Arakawa et al. | 438/673 |
| 7,049,617 B2 | 5/2006 | Iriguchi | |

FOREIGN PATENT DOCUMENTS

| | | |
|---|---|---|
| CN | 1329 357 A | 1/2002 |
| EP | 1 152 289 A2 | 11/2001 |
| JP | A-3-235319 | 10/1991 |
| JP | A-8-146400 | 6/1996 |
| JP | A-10-270339 | 10/1998 |
| JP | A-11-16817 | 1/1999 |
| JP | A-2001-142224 | 5/2001 |
| WO | WO 99/00828 | 1/1999 |
| WO | WO 03/010803 A1 | 2/2003 |

OTHER PUBLICATIONS

Iriguchi, Chiharu et al. "1.5 μm Fine-Gate TFT Fabrication on 300×300 mm² Glass Substrate using Holographic Microlithography." *SID 03 Digest*, 2003 pp. 1092-1095.

Clube, Francis et al. "0.5 μm Enabling Lithography for Low-Temperature Polysilicon Displays." *SID 03 Digest*, 2003 pp. 350-353.

Clube, Francis et al. "Large-field, high-resolution photolithography." *SPIE* vol. 3099 pp. 36-45.

* cited by examiner

METHOD FOR FABRICATING SEMICONDUCTOR DEVICE, AND ELECTRO-OPTICAL DEVICE, INTEGRATED CIRCUIT AND ELECTRONIC APPARATUS INCLUDING THE SEMICONDUCTOR DEVICE

BACKGROUND OF THE INVENTION

1. Field of Invention

The present invention relates to a method for fabricating a semiconductor device, such as a thin film transistor. More particularly, the invention relates to an exposure technique for pattern formation.

2. Description of Related Art

Processes of fabricating semiconductor devices, such as thin film transistors, use exposure techniques in order to print desired patterns on substrates. Holographic exposure techniques can be beneficial since they offer high-resolution exposure. An example of the holographic exposure techniques is described in Francis Clube et al., "Large-field, high-resolution photolithography", Proc. SPIE 1997, Vol. 3099, pp. 36-45.

SUMMARY OF THE INVENTION

In terms of cost reduction, uneven substrates, such as inexpensive glass substrates, are used for fabrication of electro-optical devices, such as liquid crystal displays. It is, however, difficult to expose a pattern on such an uneven substrate at a high resolution. If accurate projection exposure is sought at a reduced cost using a stepper or a scanner, considering the margin of error which is encountered in volume production, the resolution of the exposed image is necessarily compromised. In particular, it can become more difficult to enhance the resolution of the exposed image when large display devices are produced. In contrast, with the holographic exposure technique, theoretically no optical aberration is present so that it readily enhances the resolution of the exposed image. This holographic exposure technique, however, has the drawback of a lower throughput as compared to related art or known exposure methods using, e.g., a stepper. Therefore, repeated use of holography enhances the resolution of the exposed image, but reduces the productivity of volume production. In this respect, in the related art, it is difficult to simultaneously achieve high-resolution exposure and volume production when forming a pattern on an uneven substrate.

The present invention provides a technique that enables formation of minute patterns on an uneven substrate in volume production without reducing productivity.

To address or achieve the above, according to the present invention, in the method for fabricating a semiconductor device that includes a transistor having a gate electrode, a source/drain region, and a channel region on a substrate, at least the gate electrode is formed by a process including an exposure step through a holographic exposure mask, and the source/drain region and the channel region are formed by a process including an exposure step through a projection exposure mask.

More specifically, the method for fabricating a semiconductor device including transistors, each having a gate electrode, a source/drain region, and a channel region on a substrate, includes: first patterning a semiconductor film on the substrate to form element regions, each to be provided with the source/drain region and the channel region, second forming a gate insulating film covering segments of the patterned semiconductor film in the respective element regions, third forming the gate electrodes on the gate insulating film at predetermined positions, and fourth forming the source/drain region and the channel region in each of the element regions. Furthermore, according to the method for fabricating a semiconductor device, at least the gate electrodes are formed by a process including an exposure step through a holographic exposure mask in the third step, the element regions are formed by a process including an exposure step through a projection exposure mask in the first step, and the source/drain regions and the channel regions are formed by a process including an exposure step through a projection exposure mask in the fourth step.

As described above, the gate electrode that has the greatest influence on miniaturization of at least the transistor is formed using the holographic exposure technique so that minute patterns can be formed even on an uneven substrate. Furthermore, components other than the gate electrode are formed through the widely-used known exposure technique using the projection exposure mask, whereby the throughput is enhanced, thus maintaining the productivity of volume production. Accordingly, the tradeoff between miniaturization and volume production of the thin film transistor is eliminated so that a micro-transistor can be formed on an uneven substrate.

Preferably, the third step described above includes: forming a conductive film on the gate insulating film, forming a first photosensitive film on the conductive film using a photosensitive material, exposing the first photosensitive film through the holographic exposure mask with an exposure pattern corresponding to the gate electrodes, developing the exposed first photosensitive film and removing the first photosensitive film excluding areas corresponding to the gate electrodes, and etching the conductive film through the first photosensitive film, as a mask, remaining on the conductive film to form the gate electrodes. Thus, minute gate electrodes can be fabricated by these steps.

Preferably, the first step includes: forming a second photosensitive film on the semiconductor film using a photosensitive material, exposing the second photosensitive film through a first projection exposure mask having an exposure pattern corresponding to the element regions and an exposure pattern corresponding to a first alignment mark used for alignment of the holographic exposure mask in the third step, developing the exposed second photosensitive film and removing the second photosensitive film excluding areas corresponding to the element regions and an area corresponding to the first alignment mark, and etching the semiconductor film through the second photosensitive film, as a mask, remaining on the semiconductor film to form the element regions and the first alignment mark. The previously described steps facilitate the alignment of the holographic exposure mask in the third step.

Preferably, the first projection exposure mask includes an exposure pattern corresponding to a second alignment mark used in the second step and the subsequent steps, and the second alignment mark is formed in the first step. Accordingly, exposure masks other than the holographic exposure mask or other objects can be easily aligned by referring to the second alignment mark in steps after the first step.

Preferably, the above-described fourth step includes: forming a third photosensitive film over the element regions using a photosensitive material, the element regions corresponding to the respective transistors, exposing the third photosensitive film through a second projection exposure mask having an exposure pattern distinguishing the element regions for formation of the source/drain region and the channel region from the element regions not for the formation of the source/drain region and the channel region, developing the exposed third photosensitive film and removing the third photosensitive film excluding areas corresponding to the element regions not for the formation of the source/drain region and the channel region, and introducing an impurity to an area intended for the source/drain region within each of the element regions for the formation of the source/drain region and the channel region to form the source/drain regions and the channel regions. The second projection exposure mask is preferably aligned by referring to the second alignment mark. Accordingly, the second projection exposure mask can be easily aligned.

Preferably, the number of regions subjected to exposure in the holographic exposure mask is an integral multiple of that in the first projection exposure mask or the second projection exposure mask. Therefore, each mask is easily aligned.

Preferably, each of the first projection exposure mask and the second projection exposure mask is a reticle of a stepper or a scanner. Components other than the gate electrodes are formed through a process involving exposure using a widely-used known projection system, such as a stepper or a scanner, whereby advantageously hardly any change is made in the process of forming the semiconductor device.

The present invention includes the semiconductor device fabricated through the method for fabricating a semiconductor device described above. Furthermore, the present invention includes an integrated circuit, a circuit substrate, an electro-optical device, and an electronic apparatus, each of which utilizes the above-described semiconductor device according to the present invention.

The integrated circuit denotes a circuit including semiconductor devices, wires and the like in order to achieve a given function. The circuit substrate denotes a substrate including a plurality of semiconductor elements on one surface or the other surface and wires to connect the semiconductor devices as necessary. Examples of the circuit substrate include an active matrix substrate used for a display, such as an organic electroluminescent display.

The electro-optical device denotes a general electro-optical device including electro-optical elements which have the semiconductor devices according to the present invention and vary light emitted electrically or light from outside of the device. The electro-optical display includes a light emitting display and a display that controls light from outside of the device. Examples of the electro-optical element include a liquid crystal element, an electrophoretic element with a dispersion medium including dispersed electrophoretic particles, an electroluminescent element, and an active matrix display having electron-emitting elements that emit light by directing electrons to an emission panel, the electrons being generated by applying an electric field.

The electronic apparatus denotes a general electronic apparatus including the semiconductor devices according to the present invention with a given function. The electronic apparatus, for example, includes an electro-optical device or memory. The electronic apparatus may have any structure. Examples of the electronic apparatus include: an IC card, a cellular phone, a camcorder, a personal computer, a head mounted display, a rear projector, a front projector, a facsimile machine with a display, a viewfinder for a digital camera, a portable television, a digital signal processing device, a personal digital assistant, an electronic databook, an electronic bulletin board, an electronic billboard and the like, for example.

DETAILED DESCRIPTION OF PREFERRED EMBODIMENTS

Exemplary embodiments of the present invention are described with reference to the drawings. First, an exposure method according to the present invention is briefly described.

Figure 1:
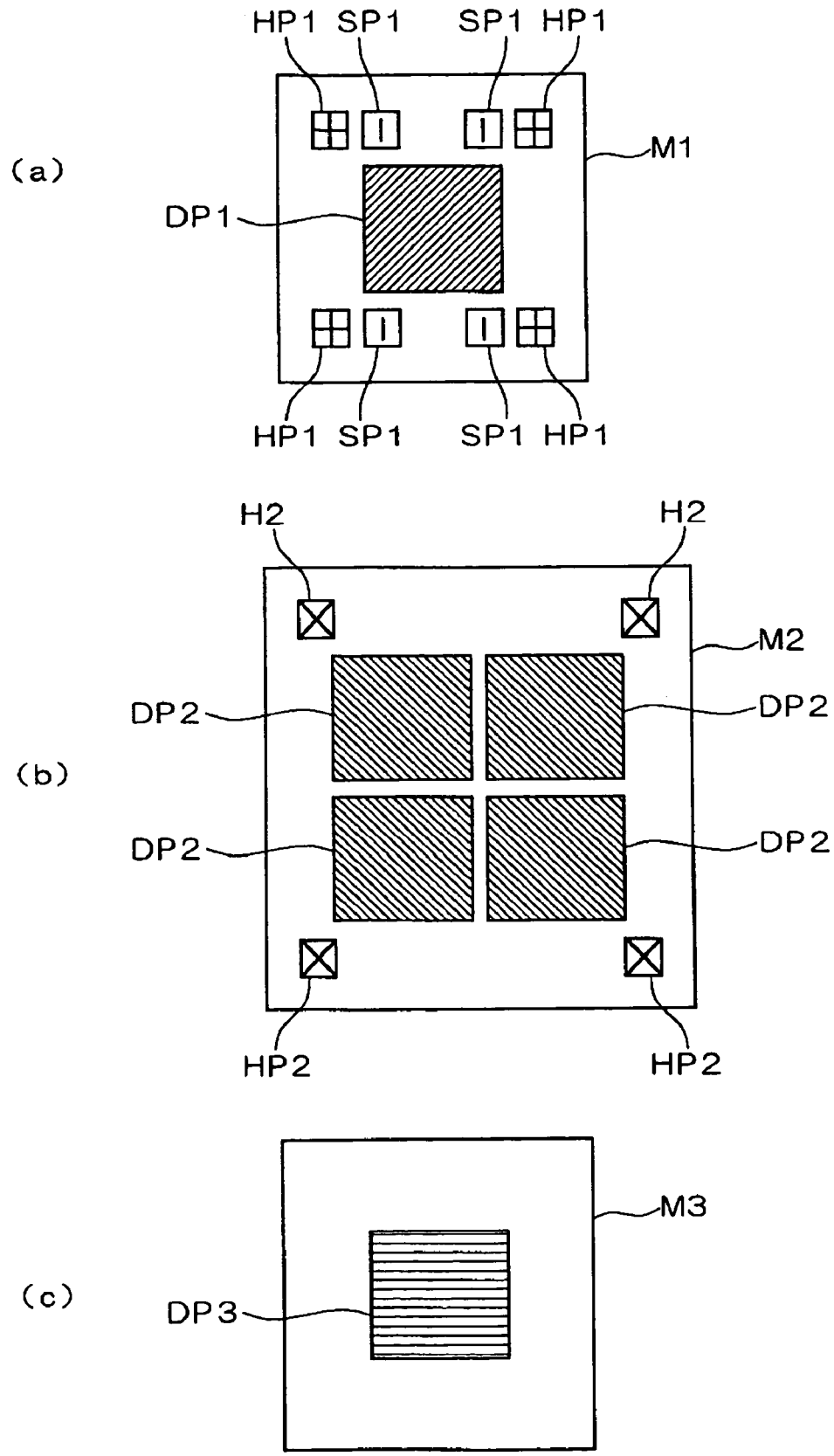
FIGS. 1(a)-1(c) are schematics describing exposure masks used in a method for fabricating a semiconductor device according to an exemplary embodiment of the present invention.

FIGS. 1(a)-1(c) are schematics describing exposure masks used in a method for fabricating a semiconductor device according to the present invention. In this exemplary embodiment, a process of fabricating semiconductor devices which include thin film elements, such as thin film transistors, is described. Exposure is performed at least three times in the process. Among the three exposures, the first and third exposures are conducted using a projection exposure system, such as a stepper or a scanner, and the second exposure is conducted using a holographic exposure system. FIG. 1(a) illustrates an exposure mask or a reticle M1 used for the first projection exposure. FIG. 1(b) illustrates an exposure mask or holographic mask M2 used for the second holographic exposure. FIG. 1(c) illustrates an exposure mask or reticle M3 used for the third projection exposure.

The exposure mask (reticle) M1 shown in FIG. 1(a) has exposure patterns used to expose a first layer of the semiconductor device. Specifically, the exposure mask M1 has an exposure pattern DP1, mark patterns HP1, and mark patterns SP1. The exposure pattern DP1 corresponds to a thin film circuit including thin film elements. The mark patterns HP1 are used to expose alignment marks for the alignment of the exposure mask M2 at a later exposure. The mark patterns SP1 are used to expose alignment marks for the alignment of the exposure mask M2 at a later exposure.

The exposure mask M2 illustrated in FIG. 1(b) has exposure patterns used to expose a second layer of the semiconductor device. Specifically, the exposure mask M2 has exposure patterns DP2 and alignment marks H2. The exposure patterns DP2 correspond to the thin film circuit including the thin film elements. The alignment marks H2 are used for alignment of the exposure mask M2.

The exposure mask (reticle) M3 illustrated in FIG. 1(c) has patterns to expose a third layer of the semiconductor device. Specifically, the exposure mask M3 has an exposure pattern DP3 for the thin film circuit including the thin film elements.

With regard to the exposure patterns, i.e., the areas subjected to exposure on the masks M1 to M3, the number of the exposure pattern(s) formed on the exposure mask M2 is an integral multiple, e.g., four times in this case, of the number of the exposure pattern(s) formed on the exposure mask M1 or the exposure mask M3.

Steps to expose a plurality of layers by laminating one layer after another after each exposure using both a stepper and a holographic exposure system using the above-described exposure masks are described below. The following description is mainly focused on the exposure process.

Figure 2:
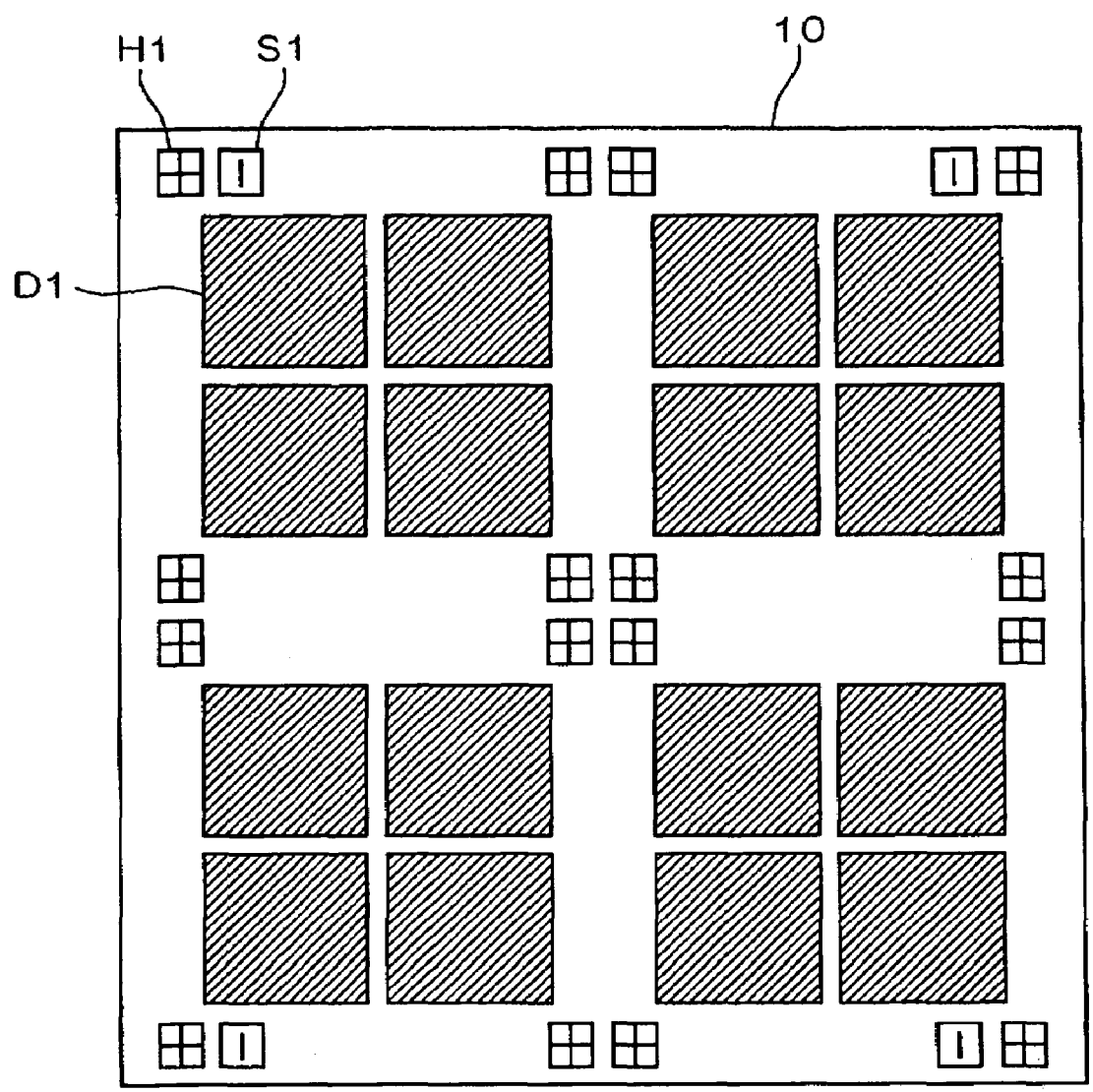
FIG. 2 is a schematic of one exposure step in the method for fabricating a semiconductor device according to another exemplary embodiment of the present invention.
Figure 3:
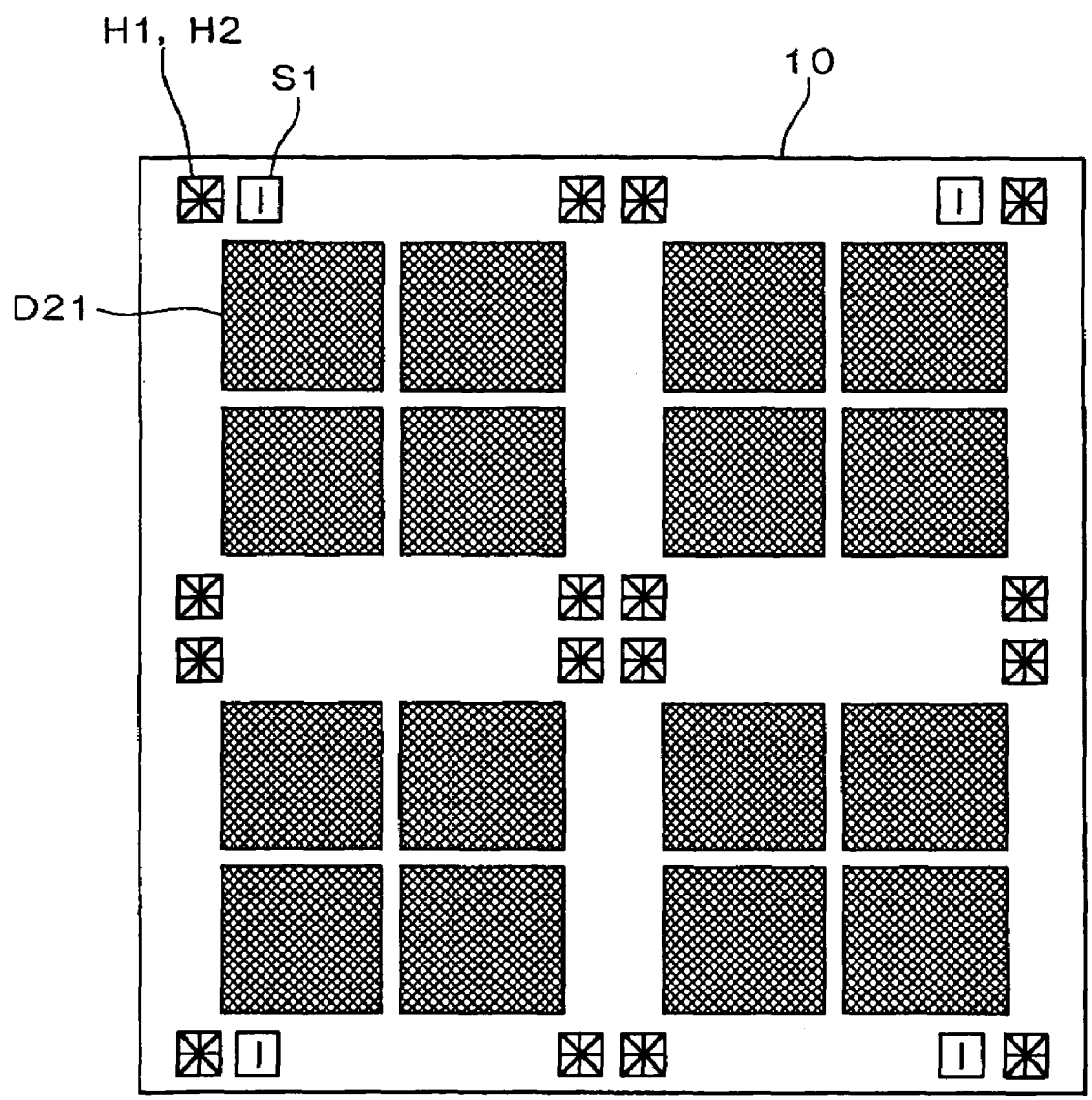
FIG. 3 is a schematic of another exposure step in the method for fabricating a semiconductor device according to the exemplary embodiment.
Figure 4:
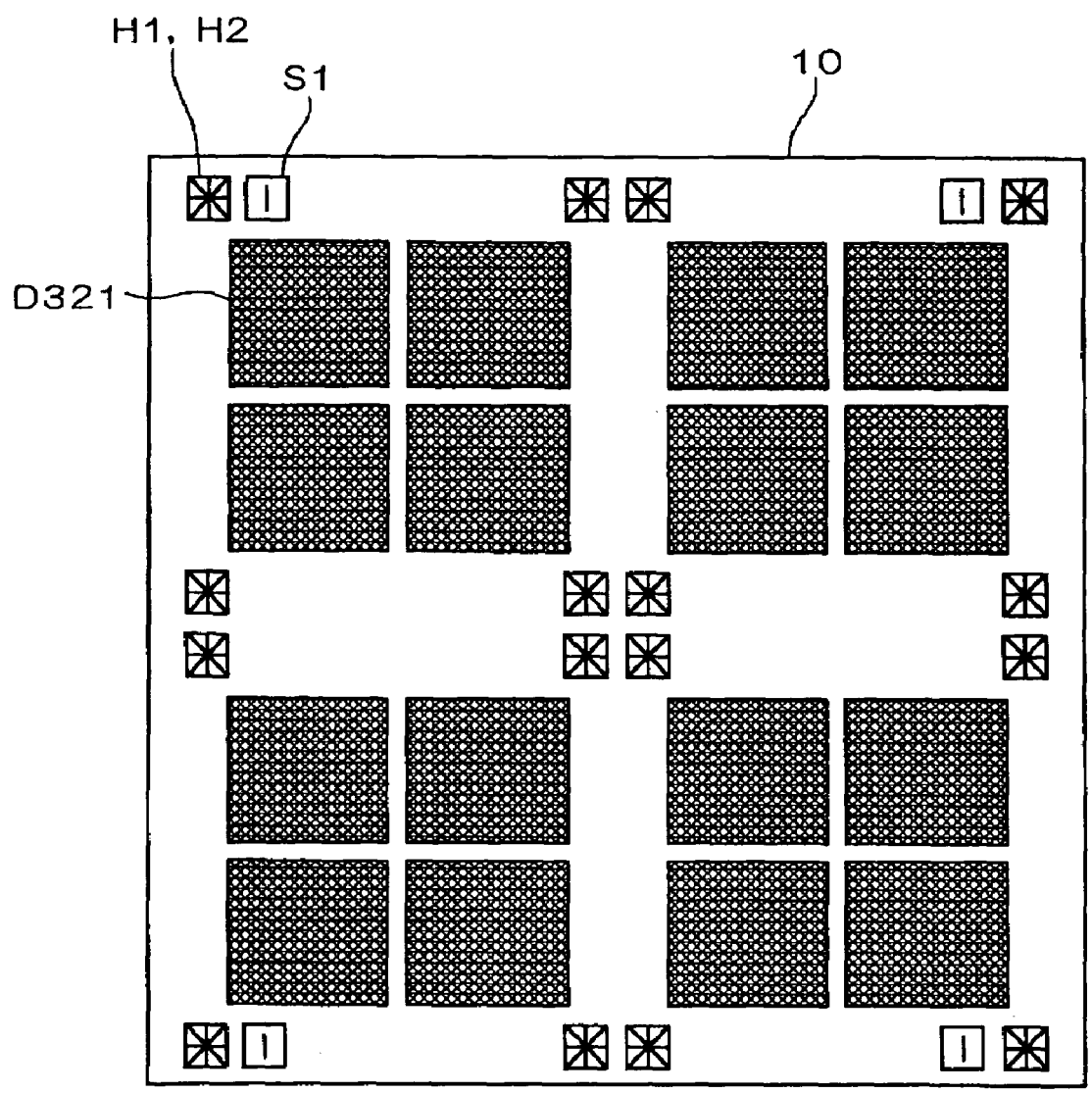
FIG. 4 is a schematic of another exposure step in the method for fabricating a semiconductor device according to the exemplary embodiment.

FIGS. 2 to 4 illustrate exposure steps in the method for fabricating the semiconductor device according to the present invention.

The first layer is exposed through the exposure mask M1 using the stepper. More specifically, as shown in FIG. 2, using the exposure mask M1, step-and-repeat is repeated a number of times, e.g., 16 times in this exemplary embodiment, whereby 16 patterns D1, each corresponding to the exposure pattern DP1, are formed over a substrate 10. Alignment marks H1 which correspond to the mark patterns HP1 and alignment marks S1 which correspond to the mark patterns SP1 are also formed on the substrate 10. Subsequently, required development and etching are conducted, thereby completing the patterning of the first layer. The process of exposing the first layer described above is referred to as a first exposure process below.

Next, the second layer is exposed through the exposure mask M2 using the holographic exposure system. More specifically, as shown in FIG. 3, patterns corresponding to the exposure patterns DP2 for the second layer are formed through the exposure mask M2 over the substrate 10 on which the patterns D1 for the first layer are formed. The patterns formed by overlaying the patterns DP2 on the patterns D1 are referred to as patterns D21 hereinbelow. Prior to the exposure, the substrate 10 is aligned with the exposure mask M2 using the alignment marks H1 formed over the substrate 10 and the alignment marks H2 formed on the exposure mask M2 and then the patterns DP2 are exposed. In this exemplary embodiment, the alignment and exposure are repeated four times to expose the entire area of the substrate 10. After that, required development and etching are conducted, thereby completing the patterning of the second layer. The process of exposing the second layer described above is referred to as a second exposure process below.

Next, the third layer is exposed through the exposure mask M3 using the stepper. More specifically, as illustrated in FIG. 4, patterns corresponding to the exposure patterns DP3 for the third layer are formed through the exposure mask M3 over the substrate 10 on which the patterns D21 for the first and second layers are formed. The patterns formed by overlaying the patterns DP3 on the patterns D21 are referred to as patterns D321 hereinbelow. Prior to the exposure, the substrate 10 is aligned with the exposure mask M3 by referring to the alignment marks S1, which are formed over the substrate 10 when the first layer is exposed, and then step-and-repeat is performed. In this way, exposure patterns for the third layer are formed on the substrate 10 at the desired positions. After that, required development and etching are conducted, thereby completing the patterning of the third layer. The process of exposing the third layer described above is referred to as a third exposure process below.

Next, a process of fabricating a semiconductor device employing the above-described exposure method according to the present invention is described below. A thin film transistor is fabricated as an example of the semiconductor device in the following description.

FIGS. 5(a)-5(d) are schematics describing steps of the process of fabricating a semiconductor device according to the exemplary embodiment.

Figure 5:
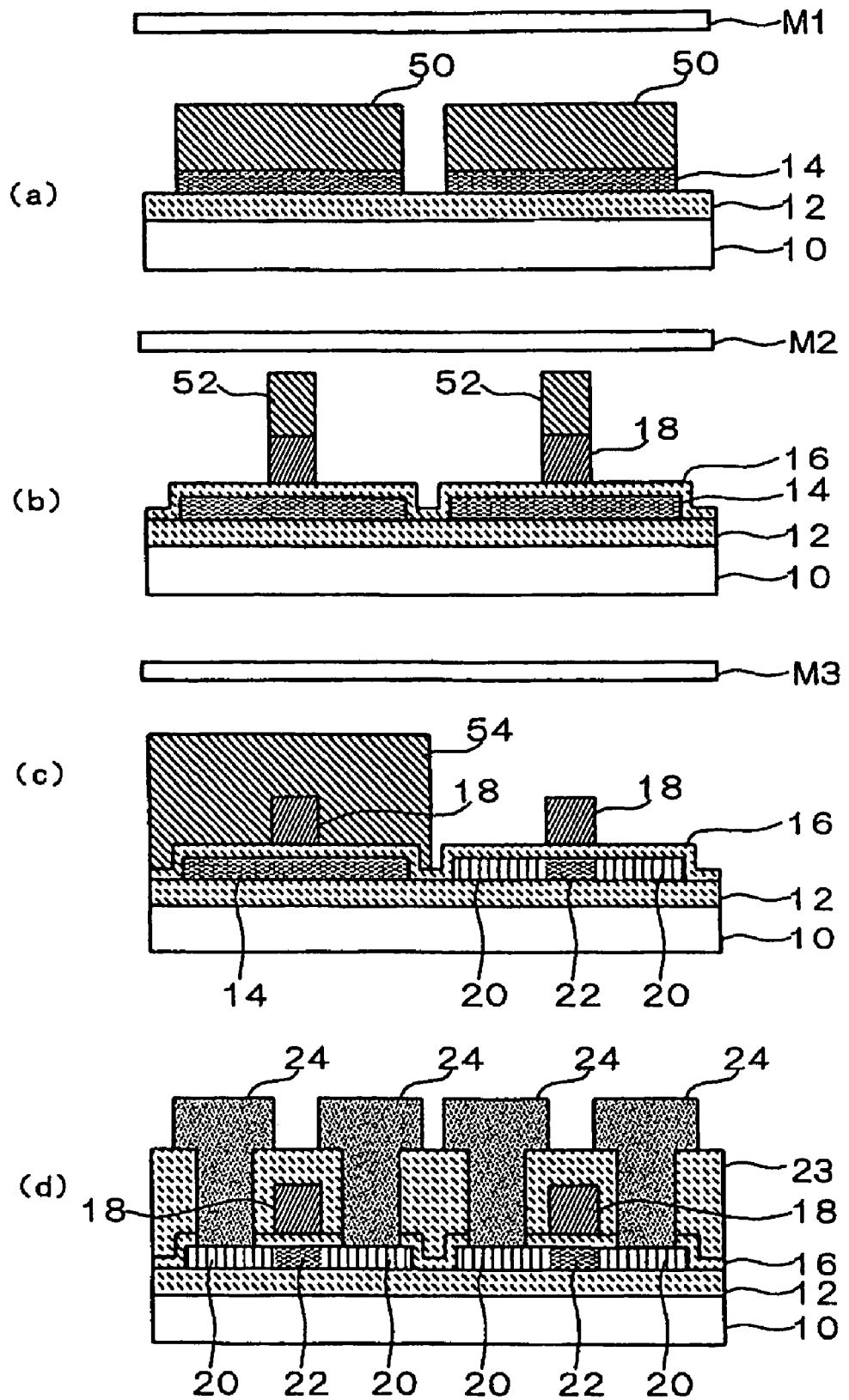
FIGS. 5(a)-5(d) are schematics describing a process of fabricating a semiconductor device according to another exemplary embodiment of the present invention.

As shown in FIG. 5(a), an underlying insulating film 12 composed of, for example, silicon oxide and silicon nitride is formed on top of the substrate 10. A semiconductor film 14 is formed on the underlying insulating film 12 and patterned to form element regions in which semiconductor devices, i.e., transistors in this exemplary embodiment, will be formed. The semiconductor film 14 is composed of, for example, a polycrystalline silicon film or an amorphous silicon film that is prepared by, for example, plasma enhanced chemical vapor deposition (PECVD), low pressure chemical vapor deposition (LPCVD) or sputtering. In this exemplary embodiment, with the use of the aforementioned first exposure process (see FIG. 2), a resist film 50 is exposed through the exposure mask M1 using a stepper to pattern the semiconductor film 14. Thereafter, the exposed resist film 50 is developed and the semiconductor film 14 is partly etched away using the resist film 50 as a mask, whereby the semiconductor film 14 is patterned with a desired shape to form element regions. An insulating film or gate insulating film 16 is formed on each segment of the patterned semiconductor film 14 through, for example, electron cyclotron resonance plasma enhanced chemical vapor deposition (ECR-PECVD) or PECVD. This insulating film 16 is composed of, for example, silicone oxide or silicon nitride and functions as a gate insulating film.

Next, a conductive film is formed over each segment of the patterned semiconductor film 14 by, for example, sputtering, and is patterned, thereby forming a gate electrode 18 on each segment of the semiconductor film 14. The gate electrode 18 is preferably composed of tantalum and aluminum. In this exemplary embodiment, with the use of the aforementioned second exposure process (see FIG. 3), a resist film 52 is exposed through the exposure mask M2 using a holographic exposure system to pattern the gate electrode 18. The resist film 52 is developed and the conductive film is partly etched away using the resist film 52 as a mask, whereby the gate electrode 18 is formed with the desired shape. Each of the gate electrodes 18 has a gate length of, for example, 0.5 µm. This second exposure process using the holographic exposure mask enables minute patterns to be exposed even on an uneven, large, glass substrate.

Next, a source/drain region 20 and a channel region or active layer 22 are formed through self-aligned ion implantation. That is, a segment of the semiconductor film 14 is doped with either a donor impurity element or acceptor impurity element using the gate electrode 18 as a mask to form the source/drain region 20 and the channel region 22. In this exemplary embodiment, with the use of the previously described third exposure process (see FIG. 4), a resist film 54 is exposed through the exposure mask M3 using a stepper to form the source/drain region 20 and the channel region 22. As shown in FIG. 5(c), prior to the ion implantation in the right segment of the semiconductor film 14 in the drawing, the resist film 54 covering the left segment of the semiconductor film 14 is exposed and developed. After that, ions are introduced to the right segment of the semiconductor film 14 while the left segment of the semiconductor film 14 is covered with the developed resist film 54. Therefore, the right segment of the semiconductor film 14 is doped with, for example, phosphorus ($P^+$) serving as an impurity element, and then is irradiated with XeCl excimer laser light with an energy density of 400 mJ/cm$^2$ to activate the impurity element, thereby forming an n-type thin film transistor. Alternatively, the impurity element may be activated through heating at a temperature of 250° C. to 400° C. In addition, a p-type thin film transistor is also formed through the above-described steps.

Next, as illustrated in FIG. 5(d), a protective insulating film 23 composed of, for example, a silicon oxide film is formed on top of the gate insulating film 16 and the gate electrodes 18. The silicon oxide film with a thickness on the order of 500 nm is preferably formed through, for example, PECVD. Contact holes are formed so as to penetrate through the gate insulating film 16 and the protective insulating film 23 reaching the source/drain regions 20. A conductive material, such as aluminum or tungsten, is deposited in the contact holes through, for example, sputtering and is patterned, thereby forming source/drain electrodes 24. In this step, exposure is performed using an appropriate exposure apparatus, such as a stepper or a holographic exposure system. Through the above-described steps, the thin film transistor illustrated in FIG. 5(d) is completed.

As described above, the holographic exposure technique is employed for at least formation of the gate electrode which has the greatest influence on the miniaturization of the thin film transistor, allowing the minute patterns to be formed even on an uneven substrate. Furthermore, components other than the gate electrode are formed through the widely-used known exposure technique using the projection exposure mask, whereby the throughput is enhanced, thus maintaining the productivity of volume production. Accordingly, the tradeoff between miniaturization and volume production of the thin film transistor is eliminated so that the micro-transistor can be formed on an uneven substrate.

Applications of the thin film transistor manufactured through the method for fabricating a semiconductor device according to the present invention are described below. Application of the thin film transistor can be found in, for example, formation of pixel circuits, each of which composes a pixel in an electroluminescent display or a liquid crystal display or a driver (integrated circuit) to control the pixel circuits.

Figure 6:
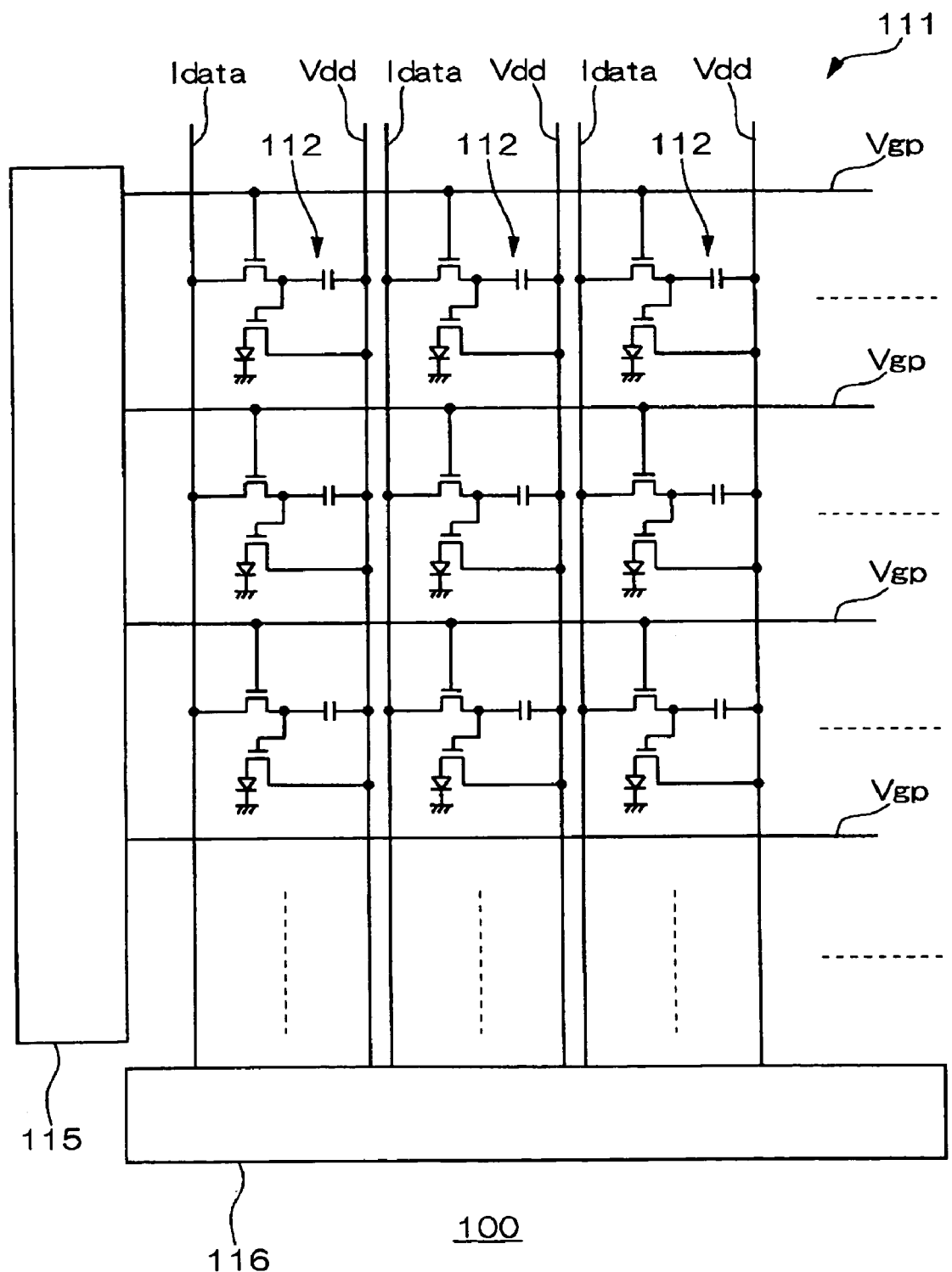
FIG. 6 is a schematic of an exemplary electro-optical device according to the present invention.

FIG. 6 illustrates the structure of an electro-optical device. An electro-optical device or display 100 according to the present exemplary embodiment includes a circuit substrate (active matrix substrate) and drivers 115 and 116. On the circuit substrate, pixel circuits 112 each having two thin film transistors, a capacitor, and a light emitting element are arranged in a matrix within a pixel region 111. The drivers 115 and 116 supply a drive signal to the pixel circuits 112. The driver 115 supplies a drive signal to each pixel region through an emission control line Vgp. The driver 116 supplies a drive signal to each pixel region through a data line Idata and a source line Vdd. Current supply to each pixel is controlled by a scan line Vgp and the data line Idata, and thus light emitted from the light emission elements is controlled. Thin film transistors constituting the pixel circuit and the drivers 115 and 116 are manufactured through the method for fabricating a semiconductor device described in the above exemplary embodiment. The organic electroluminescent display described above is merely an example of the electro-optical devices according to the present invention. Various kinds of electro-optical devices, such as liquid crystal displays, can be manufactured in the same manner as described above.

Various exemplary electronic apparatuses using an electro-optical device 100 according to the present invention are described below.

Figure 7:
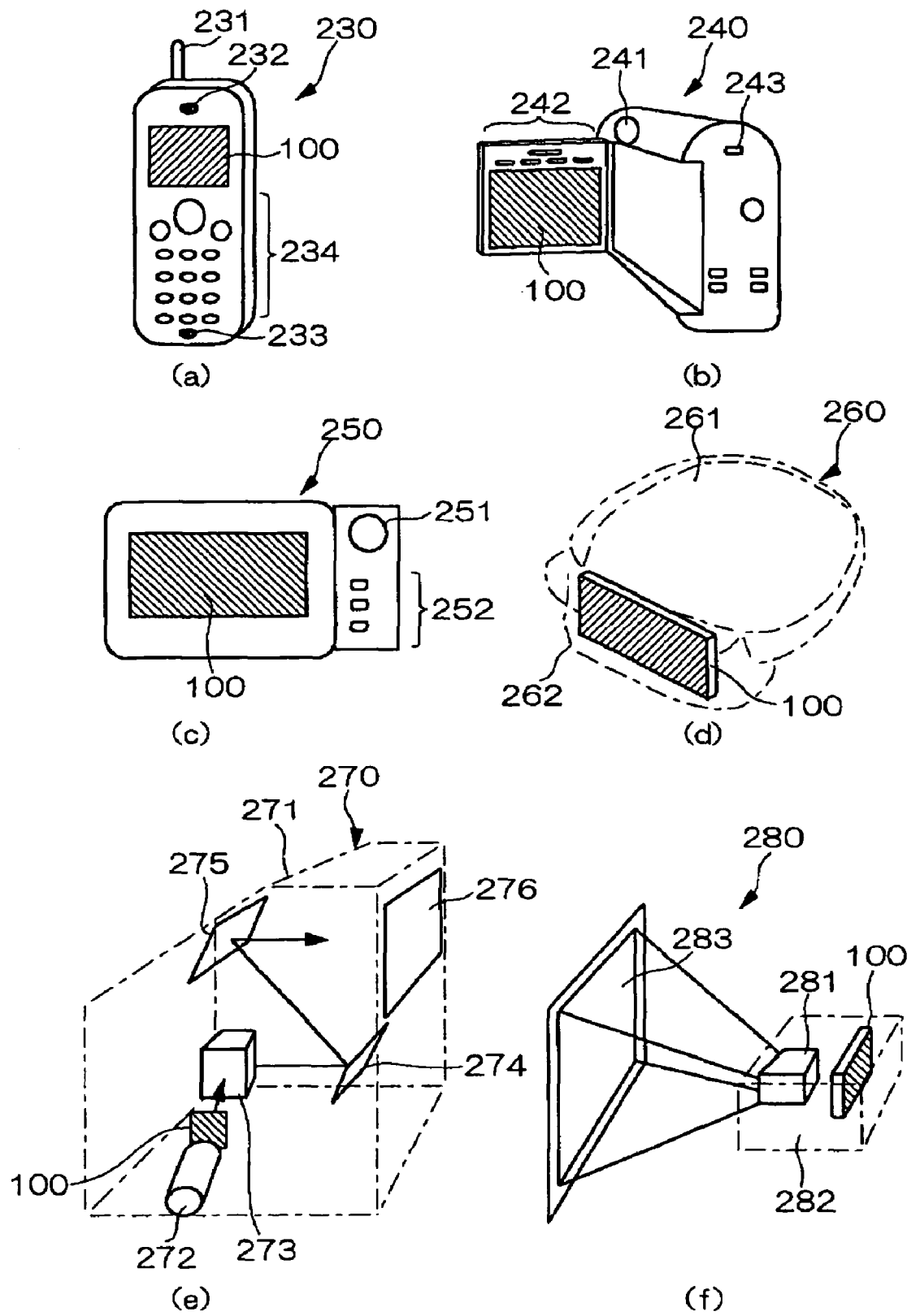
FIGS. 7(a)-7(f) are schematics of exemplary electronic apparatuses, each including the electro-optical device according to the present invention.

FIGS. 7(a)-7(f) are schematics of examples of electronic apparatuses using the electro-optical device 100. FIG. 7(a) shows an application of the electro-optical device 100 to a cellular phone. A cellular phone 230 has an antenna 231, a voice output unit 232, a voice input unit 233, a control unit 234, and the electro-optical device 100 of the present invention. The electro-optical device according to the present invention may be used as a display, as in this application.

FIG. 7(b) shows an application of the electro-optical device 100 to a video camera. A video camera 240 has an image receiving unit 241, a control unit 242, a voice input unit 243, and the electro-optical device 100 according to the present invention. The electro-optical device of the present invention may be used as a viewfinder or a display, as in this application.

FIG. 7(c) shows an application of the electro-optical device 100 to a portable personal computer, that is, a personal digital assistant (PDA). A computer 250 has a camera 251, a control unit 252, and the electro-optical device 100 of the present invention. The electro-optical device according to the present invention may be used as a display, as in this application.

FIG. 7(d) shows an application of the electro-optical device 100 to a head mounted display. A head mounted display 260 has a strap 261, an optical system 262, and the electro-optical device 100 of the present invention. The electro-optical device according to the present invention may be used as an image generator, as in this application.

FIG. 7(e) shows an application of the electro-optical device 100 to a rear projector. A projector 270 has a light source 272, a light-combining optical system 273, mirrors 274 and 275, a screen 276, and the electro-optical device 100 of the present invention in a case 271. The electro-optical device according to the present invention may be used as an image generator, as in this application.

FIG. 7(f) is an application of the electro-optical device 100 to a front projector. A projector 280 has an optical system 281 and the electro-optical device 100 of the present invention in a case 282 and displays an image onto a screen 283. The electro-optical device according to the present invention may be used as an image generator, as in this application.

The electro-optical device 100 may be applied to any electronic apparatuses that include display devices, such as an organic electroluminescent display or a liquid crystal display. The electro-optical device may be used in a facsimile machine with a display, a viewfinder for a digital camera, a portable television, an electronic databook, an electronic bulletin board, an electronic billboard and the like, for example.

The method for fabricating a semiconductor device according to the above-described exemplary embodiment may be used for fabrication of various kinds of semiconductor devices besides the electro-optical device. Examples of various kinds of memories that can be fabricated through the method for fabricating a semiconductor device of the exemplary embodiment include: a ferroelectric RAM (FeRAM), SRAM, DRAM, NOR flash memory, NAND flash memory, floating gate nonvolatile memory, and magnetic RAM (MRAM). Alternatively, the method for fabricating a semiconductor device according to the present invention may be used when fabricating an inexpensive IC tag having a microchip (IC chip) therein, the IC tag being used for a wireless communication system utilizing microwaves, for example.

The present invention is not limited to the above-described exemplary embodiments and may be varied or altered within the scope of the invention. The semiconductor film is not limited to the silicon film as in the above exemplary embodiments. Furthermore, although the thin film transistor is fabricated as an example of the semiconductor device of the present invention in the above exemplary embodiments, the semiconductor device is not limited thereto. Other devices, such as a thin film diode, may be fabricated using the fabrication method according to the present invention.

What is claimed is:

1. A method for fabricating a semiconductor device including transistors, each having a gate electrode, a source/drain region, and a channel region on a substrate, the method comprising:

first, patterning a semiconductor film on the substrate to form element regions, each to be provided with the source/drain region and the channel region, the first patterning step including:
forming a second photosensitive film on the semiconductor film using a photosensitive material,
exposing the second photosensitive film through a first projection exposure mask using a stepper or a scanner, the first projection exposure mask having an exposure pattern corresponding to the element regions and an exposure pattern corresponding to a first alignment mark used for alignment of a holographic exposure mask,
developing the exposed second photosensitive film and removing the second photosensitive film excluding areas corresponding to the element regions and an area corresponding to the first alignment mark, and
etching the conductive film through the second photosensitive film, as a mask, remaining on the semiconductor film to form the element regions and the first alignment mark;

second, forming a gate insulating film covering segments of the patterned semiconductor film in the respective element regions;

third, forming the gate electrodes on the gate insulating film at predetermined positions; and fourth, forming the source/drain region and the channel region in each of the element regions, the gate electrodes being formed by a process including an exposure step through the holographic exposure mask in the third step and the source/drain regions and the channel regions being formed by a process including an exposure step through a projection exposure mask using a stepper or a scanner in the fourth step.

2. The method for fabricating a semiconductor device according to claim 1, the first projection exposure mask including an exposure pattern corresponding to a second alignment mark used in the second step and the subsequent steps, and the second alignment mark being formed in the first step.

3. The method for fabricating a semiconductor device according to claim 2, the fourth step including:
forming a third photosensitive film over the element regions using a photosensitive material, the element regions corresponding to the respective transistors;
exposing the third photosensitive film through a second projection exposure mask having an exposure pattern distinguishing the element regions for formation of the source/drain region and the channel region from the element regions not for the formation of the source/drain region and the channel region;
developing the exposed third photosensitive film and removing the third photosensitive film excluding areas corresponding to the element regions not for the formation of the source/drain region and the channel region; and
introducing an impurity to an area intended for the source/drain region within each of the element regions for the formation of the source/drain region and the channel region to form the source/drain regions and the channel regions,
the second projection exposure mask being aligned by referring to the second alignment mark.

4. The method for fabricating a semiconductor device according to claim 3, the number of regions subjected to exposure in the holographic exposure mask being an integral multiple of that in the first projection exposure mask or the second projection exposure mask.

5. The method for fabricating a semiconductor device according to claim 3, each of the first projection exposure mask and the second projection exposure mask being at least one of a reticle of a stepper and a scanner.

6. The method for fabricating the semiconductor device according to claim 1,
the substrate being glass.

7. A method of fabricating a semiconductor device, comprising:
forming a semiconductor film over a substrate;
forming a first photosensitive film over the semiconductor film;
exposing the first photosensitive film through a first projection exposure mask having a first exposure pattern corresponding to an element region and a first alignment mark;
forming the element region and the first alignment mark by patterning the semiconductor film;
forming an insulating film over the element region;
forming a conductive film over the insulating film;
forming a second photosensitive film over the conductive film;
exposing the second photosensitive film through a holographic exposure mask having a second exposure pattern corresponding to an electrode, the holographic exposure mask being aligned with the first alignment mark;
forming the electrode over the insulating film by patterning the conductive film; and
forming a source/drain region and a channel region in the element region, the source/drain region and the channel region being formed by a process including an exposure step through a projection exposure mask using a stepper or a scanner.

8. The method of fabricating a semiconductor device according to claim 7, in the process of exposing the first photosensitive film, the first exposure pattern further corresponding to a second alignment mark, in the process of forming the element region and the first alignment mark including forming the second alignment mark, further comprising:
forming a third photosensitive film over the electrode; and
exposing the third photosensitive film through a second projection exposure mask, the second projection mask being aligned with the second alignment mark.

9. The method of fabricating a semiconductor device according to claim 7, the process of exposing the first photosensitive film including moving the first projection exposure mask by a stepper.

10. The method of fabricating a semiconductor device according to claim 7, the process of exposing the second photosensitive film including moving the holographic exposure mask by a holographic exposure system.

11. The method of fabricating a semiconductor device according to claim 7, the first photosensitive film being exposed a plurality of times in the process of exposing the first photosensitive film, the second photosensitive film being exposed a plurality of times in the process of exposing the second photosensitive film, a number of regions that is exposed in the process of exposing the second photosensitive film being an integral multiple of a number of regions that is exposed in the process of exposing the first photosensitive film.

12. The method of fabricating a semiconductor device according to claim 7, the electrode being a gate electrode that includes at least one of tantalum and aluminum.

13. A method of forming an electro-optical device, comprising:
   fabricating a semiconductor device according to claim 7.

14. A method of forming an integrated circuit, comprising:
   fabricating a semiconductor device according to claim 7.

15. A method of forming a circuit substrate, comprising:
   fabricating a semiconductor device according to claim 7.

16. A method of forming an electronic apparatus, comprising:
   fabricating a semiconductor device according to claim 7.

17. A method of fabricating a semiconductor device, comprising:
   providing an element region made of a silicon and a first alignment mark over a substrate;
   forming an insulating film over the element region;
   forming a conductive film over the insulating film;
   forming a second photosensitive film over the conductive film;
   exposing the second photosensitive film through a holographic exposure mask having a second exposure pattern corresponding to an electrode, the holographic exposure mask being aligned with the first alignment mark; and
   forming the electrode over the insulating film by patterning the conductive film,
   wherein the element region and the first alignment mark are formed by exposing the first photosensitive film through a first projection exposure mask having a first exposure pattern corresponding to the element region and the first alignment mark, the element region having a source/drain region and a channel region, the source/drain region and the channel region being formed by a process including an exposure step through a projection exposure mask using a stepper or a scanner.

* * * * *